Figure 1:
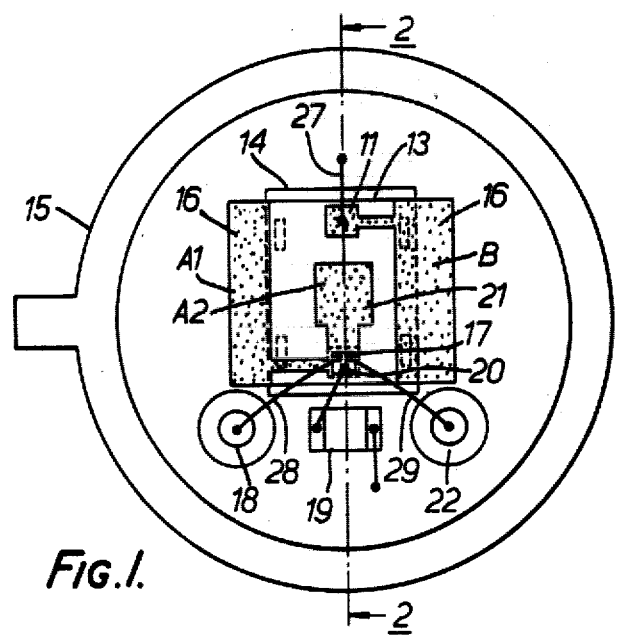

United States Patent [19]

Appleby

[11] 4,284,888
[45] Aug. 18, 1981

[54] PYROELECTRIC DETECTORS

[75] Inventor: David Appleby, Northampton, England

[73] Assignee: Plessey Handel und Investments A.G., Zug, Switzerland

[21] Appl. No.: 85,983

[22] Filed: Oct. 18, 1979

[30] Foreign Application Priority Data

Oct. 24, 1978 [GB] United Kingdom ............... 41669/78
Feb. 6, 1979 [GB] United Kingdom ............... 04132/79

[51] Int. Cl.³ .............................................. G01J 1/00
[52] U.S. Cl. ..................................... 250/338; 250/342
[58] Field of Search ........................ 250/338, 340, 342

[56] References Cited

U.S. PATENT DOCUMENTS

| 3,453,432 | 7/1969 | McHenry | 250/338 |
| 3,877,308 | 4/1975 | Taylor | 250/338 |
| 4,060,729 | 11/1977 | Byer et al. | 250/338 |

*Primary Examiner*—Alfred E. Smith
*Assistant Examiner*—Janice A. Howell
*Attorney, Agent, or Firm*—Fleit & Jacobson

[57] ABSTRACT

An intruder detector consists of an element of pyroelectric material having three defined regions; two being active to infra-red radiation and one being relatively inactive to infra-red radiation. The inactive region and one of the active regions are connected together in parallel and the other active region is connected in series with these two. The arrangement has full cancellation of environment effects while being partially unbalanced for infra-red detection so that isolated areas of infra-red radiation (such as an intruder) can be detected at long and short ranges.

The element is used with a concave mirror for increased zonal coverage.

Each of the regions of pyroelectric material has a substantially constant thickness and all of the three regions have the same thickness.

34 Claims, 4 Drawing Figures

U.S. Patent  Aug. 18, 1981  4,284,888

PYROELECTRIC DETECTORS

The principle of using an infra-red detector with a single concave mirror or multi-facetted concave mirror is well known. An extension of this idea has been described which uses a two element pyroelectric detector with a concave mirror this detector comprising either two separate elements connected with a differential amplifier means, or a twin-element constructed on a single slice of pyroelectric material, the areas of the elements being defined by the electrodes, at least one of which is transparent to radiation to be detected.

Both of the described approaches have significant disadvantages in practical installations, such as burglar alarms. Using a single element detector, the installation is susceptible, not only to modulated incoming infra-red radiation, produced by an intruder moving through a zone covered by the detector, but also to direct thermal effects produced at the detector by draughts, adiabatic temperature changes caused by air pressure fluctuations and heating effects caused by ambient light variations. The use of a twin-element detector as described can greatly minimise these potential sources of false alarms. However, when used with practical pyroelectric materials such as pyroelectric ceramics, or lithium tantalate, a sufficiently high detectivity cannot be easily attained using transparent electrodes to take full advantage of the cancellation of environmental effects.

It should be noted that the detectivity of one part of such a twin-element will be at least a factor of $\sqrt{2}$ lower than a single element of the same size and equivalent design. Furthermore, it is desirable that both parts of the twin-element should be active to incoming infra-red radiation, since this can effectively double the zonal coverage as compared with a single element detector. It also provides for cancellation of non-localised changes in incoming infra-red radiation within the field of view of the installation, although this effect is of secondary importance. The primary disadvantage in having both parts of the twin-element responsive is that at short ranges an intruder can simultaneously fill the fields of view of both, thus producing a near-zero net output signal; and hence the intruder can remain undetected.

It is an object of the present invention therefore to provide a pyroelectric detector suitable for passive infra-red intruder alarm applications which exhibits, in principle substantially full cancellation of environmental effects at the detector whilst being partially unbalanced for infra-red detection purposes, and which has sufficient detectivity as a result of improved infra-red absorption.

According to the present invention a pyroelectric detector comprises an element of pyroelectric material having two regions connected in parallel with each other, one being active, and the other being relatively inactive to infra-red radiation, and a third region connected in series with the other two regions and being oppositely polarized and active to infra-red radiation.

Preferably the area of the third region is substantially equal to the combined area of the first two regions.

Preferably the regions of the elements which are active to infra-red radiation are provided with an infra-red absorbing coating.

The coating may comprise platinum black applied electrochemically.

Preferably each of the regions of the pyroelectric material has a substantially constant thickness and all of the three regions preferably have substantially the same thickness.

Preferably the region of the element which is relatively inactive to infra-red radiation is provided with a nontransparent electrode which is highly reflective to infra-red radiation.

The non-transparent electrode may comprise a layer of evaporated nichrome and gold.

The pyroelectric material of the element may be a ceramic such as lead zirconate iron niobate or a single crystal such as lithium tantalate.

Preferably the three regions of the element are mounted with similar thermal isolation from the casing of the detector.

Preferably the regions of the element which are active to infra-red radiation have a ratio of areas of approximately 3:2.

The invention also comprises a pyroelectric detector as set forth above provided with a concave mirror or a multi-facetted concave mirror to provide increased zonal coverage of the detector.

Figure 2:
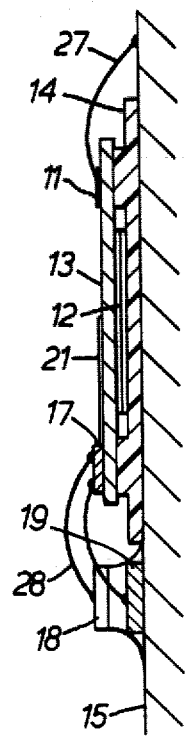
Figure 3:
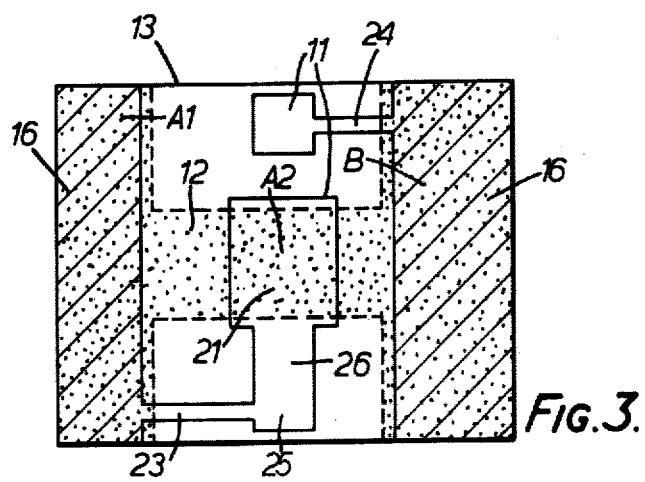
Figure 4:
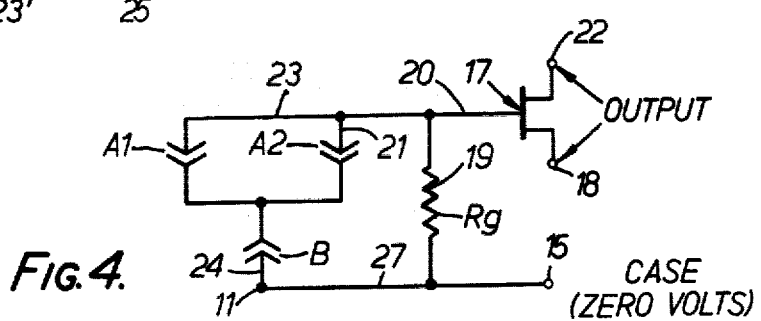

An embodiment of the invention will now be described by way of example only with reference to the accompanying drawings in which FIG. 1 illustrates in plan view a pyroelectric detector in accordance with the invention suitable for passive infra-red intruder alarm applications, FIG. 2 is a cross-sectional view taken along line 2—2 on FIG. 1, FIG. 3 is an enlarged view of an element of pyroelectric material used in the detector and FIG. 4 is an equivalent circuit diagram of the detector.

A pyroelectric element 13, comprises three defined active areas (A1, A2 and B) and consists of a slice of pyroelectric material. The slice is supported by an insulating substrate (14) designed to provide adequate mechanical support for the pyroelectric and its connection areas and maximum thermal isolation of the active areas A1, A2 and B from a transistor header (15), on which the element 13 is supported. The areas A1 and B are infra-red active by virtue of an infra-red absorbing coating (16) and are shown cross hatched in FIG. 3.

A part A2 is relatively inactive by its absence of coating, infra-red radiation being reflected from the surface of a top electrode 21. A junction F.E.T. chip (17) is epoxy resin bonded to a connection pad 25 which has a connection 23 to the coating 16 on the area A1 and a connection 26 to the electrode 21. The gate 20 of the F.E.T. chip is connected to the pad 25 and the chip operates as an impedance converter, the source and drain connections being wire-bonded by wires 28 and 29 to header terminals (18) and (22) respectively. A high value resistor (19) provides a leakage resistance to the transistor header (15), ground in order to bias the gate 20 of the F.E.T.

A further electrode 12 on the back of the element 13 (shown as a dotted area in FIG. 3) connects the areas A1 and A2 to the area B. An electrode 11 on the top surface of the element 13 has a connection 24 to the coating 16 on the area B and is connected to the transistor header 15 ground with a wire 27.

The whole structure is hermetically enclosed in a casing having an infra-red transmitting window (not shown)

In practice the electrode material of the electrodes 11, 12 and 21 could be evaporated nichrome and gold and the infrared absorbing coatings 16 could be electrochemically applied platinum black. The substrate 14, could be any suitable material of low thermal conductivity e.g. plastic or glass. The material of the pyroelectric element 13 could be a ceramic such as lead zirconate iron niobate or a single crystal such as lithium tantalate. A pyroelectric material having an intrinsic controlled high resistivity such as conducting lead zirconate iron niobate pyroelectric ceramic (U.K. Pat. No. 1,514,472) could also be used. In this case the chip resistor 19 could be absent. The polarisation of the areas of the element 13 as shown by the arrows in FIG. 4 could easily be achieved by the use of a pre-polarised slice of pyroelectric material for fabrication of the element.

The electrode areas shown in FIG. 1 would be suitable for use in a passive infra-red intruder alarm with either a single concave mirror or focal length approximately 40 mm or a multifacetted mirror with, for example, nine zones of focal length 30 mm, spaced at 11.5° angular separations. The detector active areas in such a multi-zone system would split each mirror zone approximately equally to give two subzones, giving a total angular coverage of approximately 100°.

It is important that the three active regions A1, A2 and B in such a device are mounted such as to give a similar amplitude and phase response to low frequency thermal changes transmitted through the detector casing and element substrate 14 in order to cancel as far as possible environmental changes at the detector. In practise the design of the substrate 14 and element 13 would be optimised to provide for this.

The degree of imbalance between the areas A1 and B of the element responsible to infra-red radiation should be such that satisfactory sensitivity is retained by these areas for detection at long ranges but a sufficiently large difference signal can be generated for detection at short ranges. A typical ratio of the areas of B to A1 of approximately 3:2 would be satisfactory for these purposes, and typical sizes for these areas could be 3 mm² for B and 2 mm² for A1 arranged approximately 3 mm apart.

The relative areas of the respective regions of the element are not as important as the pyroelectric material parameters and the thickness of the pyroelectric material. It is important that the material parameters and the thickness of the slice of pyroelectric material are relatively constant over all three regions of the element so that the voltage developed by the three regions is substantially equal.

What is claimed is:

1. A pyroelectric detector comprising an element of pyroelectric material, said element having first and second regions, said first and second regions being connected in parallel with each other, said first region being active to infra-red radiation to produce a first output, said second region being relatively inactive to infra-red radiation so as to produce a null output, said element having a third region, said third region being connected in series with said first and second regions, said third region being oppositely polarized and active to infra-red radiation to produce a further output, wherein said first and further outputs are compared to each other, and are each compared to said null output, whereby to detect intrusion at both near and far ranges.

2. A pyroelectric detector as claimed in claim 1 wherein the area of said third region is substantially equal to the combined areas of said first and second regions.

3. A pyroelectric detector as claimed in claim 1 wherein said first and third regions of the element which are active to infra-red radiation are provided with infra-red absorbing coatings.

4. A pyroelectric detector as claimed in claim 3 wherein said coatings comprise platinum black applied electrochemically.

5. A pyroelectric detector as claimed in any one of claims 1, 2, 3 or 4 wherein each of said three regions of the pyroelectric material has a substantially constant thickness.

6. A pyroelectric detector as claimed in any one of claims 1, 2, 3 or 4 wherein all of said three regions have substantially the same thickness.

7. A pyroelectric detector as claimed in any one of claims 1, 2, 3 or 4 comprising an electrode, said electrode being non-transparent and highly reflective to infra-red radiation, said electrode being mounted on said second region of said element which is relatively inactive to infra-red radiation.

8. A pyroelectric detector as claimed in claim 7 wherein said non-transparent electrode comprises a layer of evaporated nichrome and gold.

9. A pyroelectric detector as claimed in any one of claims 1, 2, 3 or 4 wherein said pyroelectric material of said element comprises a ceramic.

10. A pyroelectric detector as claimed in claim 9 wherein said ceramic comprises lead zirconate iron niobate.

11. A pyroelectric detector as claimed in any one of claims 1, 2, 3 or 4 wherein said pyroelectric material comprises a single crystal.

12. A pyroelectric detector as claimed in claim 11 wherein said single crystal comprises lithium tantalate.

13. A pyroelectric detector as claimed in any one of claims 1, 2, 3 or 4 comprising a casing and thermal isolation means for providing thermal isolation between said casing and said element, said thermal isolation means being mounted on said casing and said element being mounted on said thermal isolation means.

14. A pyroelectric detector as claimed in any one of claims, 1, 2, 3 or 4 wherein said first and third regions of said element which are active to infra-red radiation have a ratio of areas of approximately 3:2.

15. A pyroelectric detector as claimed in any one of claims 1, 2, 3 or 4 comprising a concave mirror providing increased zonal coverage of said detector.

16. A pyroelectric detector as claimed in claim 5 wherein all of said three regions have substantially the same thickness.

17. A pyroelectric detector as claimed in claim 5 comprising an electrode, said electrode being non-transparent and highly reflective to infra-red radiation, said electrode being mounted on said second region of said element which is relatively inactive to infra-red radiation.

18. A pyroelectric detector as claimed in claim 6 comprising an electrode, said electrode being non-transparent and highly reflective to infra-red radiation, said electrode being mounted on said second region of said element which is relatively inactive to infra-red radiation.

19. A pyroelectric detector as claimed in claim 5 wherein said pyroelectric material of said element comprises a ceramic.

20. A pyroelectric detector as claimed in claim 6 wherein said pyroelectric material of said element comprises a ceramic.

21. A pyroelectric detector as claimed in claim 7 wherein said pyroelectric material of said element comprises a ceramic.

22. A pyroelectric detector as claimed in claim 5 wherein said pyroelectric material comprises a single crystal.

23. A pyroelectric detector as claimed in claim 6 wherein said pyroelectric material comprises a single crystal.

24. A pyroelectric detector as claimed in claim 7 wherein said pyroelectric material comprises a single crystal.

25. A pyroelectric detector as claimed in claim 5 comprising a casing and thermal isolation means for providing thermal isolation between said casing and said element, said thermal isolation means being mounted on said casing and said element being mounted on said thermal isolation means.

26. A pyroelectric detector as claimed in claim 6 comprising a casing and thermal isolation means for providing thermal isolation between said casing and said element, said thermal isolation means being mounted on said casing and said element being mounted on said thermal isolation means.

27. A pyroelectric detector as claimed in claim 7 comprising a casing and thermal isolation means for providing thermal isolation between said casing and said element, said thermal isolation means being mounted on said casing and said element being mounted on said thermal isolation means.

28. A pyroelectric detector as claimed in 5 wherein said first and third regions of said element which are active to infra-red radiation have a ratio of areas of approximately 3:2.

29. A pyroelectric detector as claimed in 6 wherein said first and third regions of said element which are active to infra-red radiation have a ratio of areas of approximately 3:2.

30. A pyroelectric detector as claimed in 7 wherein said first and third regions of said element which are active to infra-red radiation have a ratio of areas of approximately 3:2.

31. A pyroelectric detector as claimed in claim 15 wherein said concave mirror is multi-faceted.

32. A pyroelectric detector as claimed in claim 5 comprising a concave mirror providing increased zonal coverage of said detector.

33. A pyroelectric detector as claimed in claim 6 comprising a concave mirror providing increased zonal coverage of said detector.

34. A pyroelectric detector as claimed in claim 7 comprising a concave mirror providing increased zonal coverage of said detector.

* * * * *